United States Patent [19]

Leake et al.

[11] Patent Number: 4,885,485
[45] Date of Patent: Dec. 5, 1989

[54] CMOS OUTPUT BUFFER PROVIDING MASK PROGRAMMABLE OUTPUT DRIVE CURRENT

[75] Inventors: William W. Leake, Eagan; Rai Surinder, Plymouth, both of Minn.

[73] Assignee: VTC Incorporated, Bloomington, Minn.

[21] Appl. No.: 238,565

[22] Filed: Aug. 30, 1988

[51] Int. Cl.$^4$ .................. H03K 3/013; H03K 5/13; H03K 17/28; H03K 17/687

[52] U.S. Cl. .................. 307/542; 307/443; 307/448; 307/473; 307/594; 307/596

[58] Field of Search ............ 307/448, 451, 452, 542, 307/552, 558, 555, 568, 572, 584, 592, 594, 473, 303.2, 596; 377/116, 117, 121, 122

[56] References Cited

U.S. PATENT DOCUMENTS

| | | | |
|---|---|---|---|
| 3,593,033 | 7/1971 | Shimizu et al. | 377/122 |
| 3,603,810 | 9/1971 | Clayson | 377/122 X |
| 3,641,370 | 2/1972 | Heimbigner | 377/122 X |
| 3,943,551 | 3/1976 | Skorup | 357/42 |
| 4,012,645 | 3/1977 | Moorey | 307/594 X |
| 4,115,740 | 9/1978 | Yoshida et al. | 307/572 X |
| 4,414,480 | 11/1983 | Zasio | 307/443 |
| 4,621,208 | 11/1986 | van Tran | 307/473 |
| 4,634,893 | 1/1987 | Craycraft et al. | 307/270 |
| 4,638,187 | 1/1987 | Boler et al. | 307/451 |
| 4,725,747 | 2/1988 | Stein et al. | 307/594 X |
| 4,789,793 | 12/1988 | Ehni et al. | 307/594 X |

Primary Examiner—Stanley D. Miller
Assistant Examiner—David R. Bertelson
Attorney, Agent, or Firm—Kinney & Lange

[57] ABSTRACT

A CMOS output buffer interconnects binary logic integrated circuits. The output buffer is readily configurable through variation of a single metallization mask during fabrication for providing interconnection of integrated circuits through either transmission lines or lumped loads. The CMOS output buffer provides a pull-up circuit for pulling an output terminal to a voltage level corresponding to a first logical state and a pull-down circuit for pulling the output terminal to the complementary logical state. The pull-up and pull-down circuits each include a plurality of parallel connectable output drivers. A selected number of output drivers can be connected to the output terminal during fabrication of the integrated circuit through the appropriate metallization mask. The pull-up and pull-down circuits each include a distributed, continuous control electrode providing for delayed propagation of actuation signals. Selective metallization between points of a control electrode prescribes different time rates of propagation of an actuation signal.

26 Claims, 3 Drawing Sheets

CMOS OUTPUT BUFFER PROVIDING MASK PROGRAMMABLE OUTPUT DRIVE CURRENT

BACKGROUND OF THE INVENTION

1. Field of the Invention

The present invention relates to CMOS output buffer circuits and in particular to an integrated CMOS output buffer adaptable for use in transmitting logic signals onto integrated circuit interconnection links including links with lumped load or transmission line characteristic input impedances.

2. Description of the Prior Art

Integrated logic circuit interconnection is provided by output buffer drivers which are typically tristate devices. The three states are a logic 1 state corresponding to a first voltage level, a logic 0 state corresponding to a second voltage level and a floating level between the first and second levels which does not correspond to a logic signal. A common characteristic among a number of prior art output buffers is the presence of distinguishable circuit portions providing pull up of the voltage level on an output terminal and pull down of the voltage level on the output terminal, corresponding to the logic 1 and logic 0 signal levels, respectively. Control logic provides switching of the pull-up and pull-down circuits for connecting the output terminal to a selected voltage level.

In the floating state, the pull-up and pull-down circuits are in a nonconducting state which provides a high impedance with respect to other signals which can appear on the output terminal of the buffer from an interconnection link such as a transmission line.

Integrated logic circuits are now used in a wide variety of electronic systems and operate at a variety of frequencies. The circuit link between integrated circuits can be a relatively short conductive path with a characteristic impedance at the transmission frequency determined by the input impedance of the destination integrated circuit (i.e. a lumped load). Alternatively, the circuit link can be a transmission line with a characteristic impedance of a distributed load.

Where an interconnection is a lumped load, undesirable voltage ground bounce and current ringing are reduced by slowing the rate o rise of the current pulse of the output signal. For a distributed load, i.e. a transmission line, delivery of substantially all of the final drive current at turn on of the pull-up or pull-down driver is preferred for driving the load properly.

Prior art interconnection drivers have either been specific to one or the other of the above types of loads, or they have been devices with compromised output characteristics. An example of such a prior art device is U.S. Pat. No. 4,638,187 for a "CMOS Output Buffer Providing High Drive Current With Minimum Output Signal Distortion", issued Jan. 20, 1987, to Boler et al and assigned to the assignee of the present invention which is directed to an output buffer advantageously used with lumped loads.

Boler et al teach pull-up and pull-down circuits for connecting an output terminal to one of two potential levels. The pull-up circuit includes first and second field effect transistors connected in parallel between an output terminal and a source of a first potential level, and a delay element for delaying turn on of the second field effect transistor with respect to the first field effect transistor. The pull-down circuit provides third and fourth field effect transistors connected in parallel between the output terminal and a source of the second potential level. The nature of the control electrode of the fourth field effect transistor delays turn on of the fourth field effect transistor with respect to the third field effect transistor. The first field effect transistor is of a complementary conductivity type with respect to the second field effect transistor and the third and fourth field effect transistors are of the same conductivity type as the first field effect transistor.

Boler et al achieve turn on delay by two different techniques. The pull-up circuit provides output driver field effect transistors which are complementary devices, with an inverter stage being utilized to delay turn on of the second output driver field effect transistor relative to the first output driver field effect transistor. In the pull-down circuit two n channel field effect transistors provide the output drivers. The pull-down field effect transistors function as a single distributed transistor. A polysilicon gate electrode with a nonnominal resistance per unit length causes turn on to be propagated along the width of the channel of the distributed device, resulting in a graduated turn on of the field effect transistor.

SUMMARY OF THE INVENTION

The present invention is an improved output buffer which can be adapted through minor changes in connections between circuit elements to provide a CMOS output buffer for a lumped load, a distributed load, or a mixed load. Total final output current is also modifiable.

The CMOS output buffer includes both pull-up and pull-down circuits. The pull-up and pull-down circuits each comprise a plurality of parallel n channel output driver insulated gate field effect transistors ("IGFET"). Adaptation of the output buffer is effected by changes to circuit element connections in a metallization pattern applied to the circuit. For lumped load interconnection, the CMOS output buffer is adapted to provide current switching distributed over time for either the pull-up or the pull-down circuits. A metallization pattern suitable for a lumped load provides cascaded turn on of IGFETs. A metallization pattern suitable for use with a transmission line eliminates the cascading turn-on of the output driver IGFETs providing for their substantially simultaneous turn on.

Another metallization pattern provides for adjustment of the final output current.

Accordingly, an output buffer for prescribing different parameters of an output signal developed on an output terminal is described. The output buffer includes a pull-up circuit responsive to a first signal generated by a logic network for applying a first potential level to the output terminal. The pull-up circuit includes a plurality of parallel output driver transistors, each driver transistor having a source electrode, a drain electrode and a gate electrode. The drain electrodes are connected to a first potential source. Selected source electrodes are connected to the output terminal dependent upon the metallization pattern used in fabrication of the circuit. The gate electrodes are portions of a first continuous, doped polysilicon gate on which a turn on signal propagates. Selected points along the first gate can be short-circuited to one another through selective metallization for prescribing an increased propagation rate of the turn on signal.

The output buffer further includes a pull-down circuit responsive to a second signal generated by the logic network for connecting the output terminal to a second potential source corresponding to the logic 0 level. The pull-down circuit includes a plurality of parallel output driver transistors, each driver transistor having a source electrode, a drain electrode and a gate electrode. Each source electrode is connected to the second potential source. Selected drains are connected by the metallization pattern to the output terminal. The gate electrodes are portions of a second continuous gate disposed over the channel regions of the pull-down output driver transistors. Selected points along the second gate may be shorted to one another to prescribe the time rate of response of the transistors of the pull-down circuit to a turn on signal.

The driver transistors of the preferred embodiment of the present invention are all n channel devices. Use of n-channel devices saves space while providing a device which can be adapted to produce between 4 milliamps and 64 milliamps of output signal current. N channel devices are also faster than P channel devices. Total voltage swings are smaller and the N channel device provides better impedance matching where the load driven is distributed.

DETAILED DESCRIPTION OF THE PREFERRED EMBODIMENTS

Figure 1:
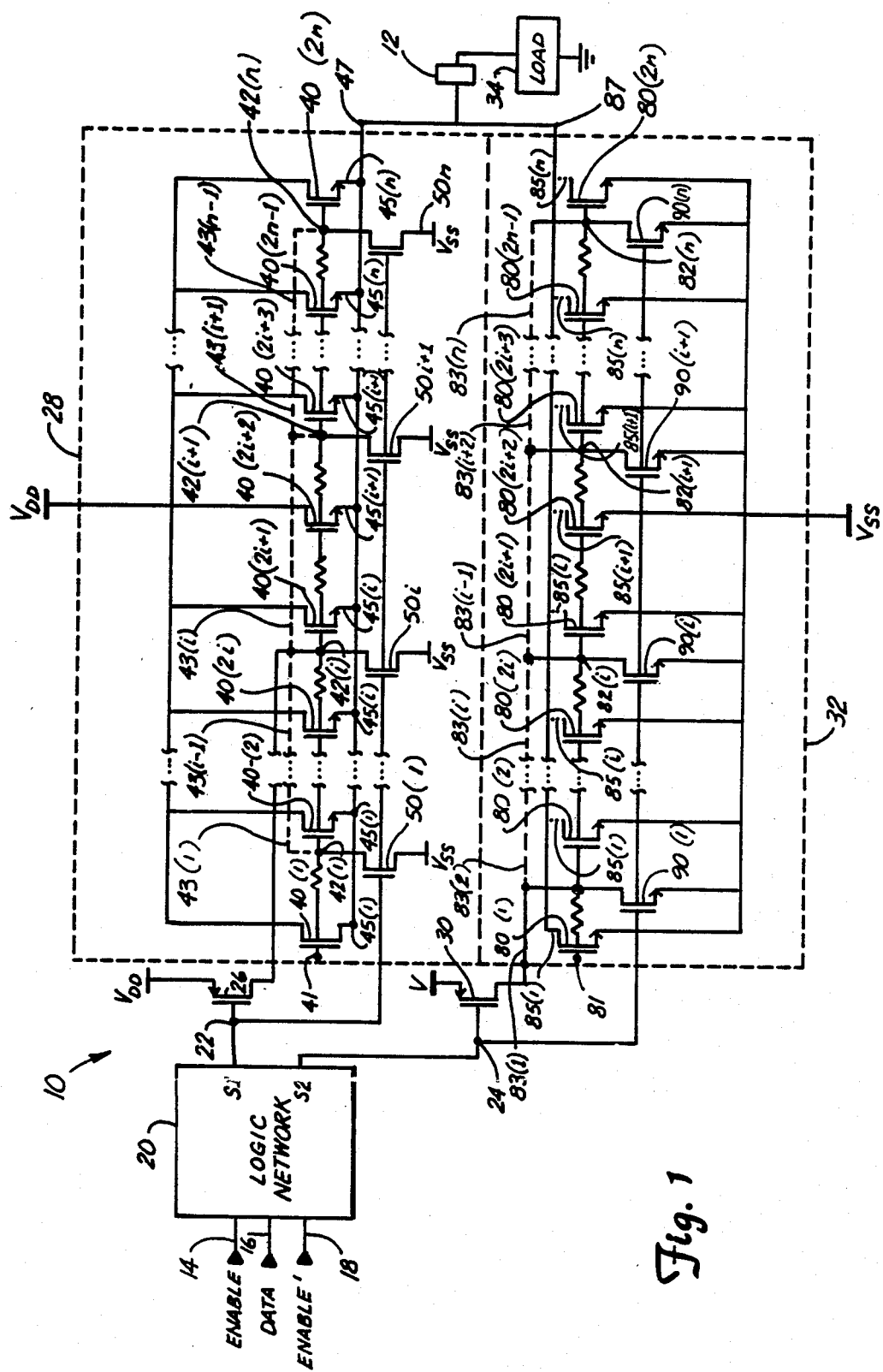
FIG. 1 is a circuit schematic of the CMOS output buffer with prescribable output signal parameters.

FIG. 1 illustrates a CMOS output buffer 10 which provides an output signal on an output terminal 12 based upon input signals received on enable terminal 14, on data terminal 16 and, optionally, on enable terminal 18 (shown in shadow). Output buffer 10 includes a logic network 20 for generating a first control signal S1 on terminal 22 and a second control signal S2 on terminal 24. Terminal 22 is connected to the gate of a p channel insulated gate field effect transistor ("IGFET") 26 for controlling turn on of pull-up circuit 28 and into the pull-up circuit for controlling turn off of the pull-up circuit. Terminal 24 is connected to the gate of p channel IGFET 30 for controlling turn-on of pull-down circuit 32 and into pull-down circuit 32 for controlling turn off of the pull-down circuit. A load 34, which may be either a lumped, distributed or have mixed characteristics, is connected to output terminal 12.

Pull-up circuit 28 includes a plurality of n channel IGFETs 40(1) through 40(2n) for connecting output terminal 12 to a source of potential level $V_{DD}$. IGFETs 40(1) through 40(2n) have a continuous distributed gate 41 which is connected at point 42(i) to the drain of IGFET 26. IGFET 26 is responsive to signal S1 to connect or disconnect gate electrode 41 to potential source $V_{DD}$ depending on the state of signal S1.

Distributed gate 41 is a continuous, doped polysilicon path with a characteristic resistance per unit length. The gate electrode for each IGFET 40(i) is a portion of gate 41. Gate 41 is depicted as including discrete resistances disposed between each adjacent gate electrode of IGFETs 40(1) through 40(2n), respectively. It will be understood, however, that the resistance is actually continuous. Selected adjacent pairs of points 42(1) through 42(n) along gate 41 can be connected along conductive paths 43(1) through 43(n−1), depending upon the metallization pattern used. Interconnection of a representative adjacent pair 42(i) and 42(i+1) by conductive path 42(i) results in a turn on signal appearing at points 42(i) and 42(i+1) at substantially the same instant. Absent interconnection of any pair of adjacent connection points from among points 42(1) through 42(n), a signal appearing on gate 41 would propagate along gate 41 from point 42(i) toward points 42(i+1) and 42(i−1), with the gate electrodes topologically closest to connection point 42(i) along gate 41 turning on first. An actuation signal generated by IGFET 26 is, where all metallization patterns 43(1) through 43(n−1) are present, propagated substantially synchronously to the gate electrodes of IGFETs 41(1) through 42(n).

IGFETs 40(1) through 40(2n) are connected at their drains to potential level $V_{DD}$. Each successive pair of IGFETs 40(1) and 40(2) through IGFETs 40(2n−1) and 40(2n) have common sources. Selected successive adjacent pair of IGFETs 40(i) and 40(i+1) are connected by conductive path 45i to conductive path 47, which is connected to output terminal 12. Successive adjacent pairs of conductive paths 45i are given the same designation because, as will become clear with reference to FIG. 3, they correspond with single structural elements.

Pull-up circuit 28 further includes a plurality of gate control IGFETs 50(1) through 50(n) connected in parallel between distributed gate 41 and a source of a potential $V_{SS}$. IGFETs 50(1) through 50(n) are turned on and off in opposite phase as IGFET 26. IGFETs 50(1) through 50(n) apply $V_{SS}$ to gate 41, causing output driver IGFETs 42(1) through 42(n) to turn off substantially synchronously.

Pull-down circuit 32 is adapted to connect output terminal 12 to a source of a second potential level $V_{SS}$ in response to a second control signal S2 appearing on terminal 24. Pull-down circuit 32 includes a plurality of n channel IGFETs 80(1) through 80(2n) connected in parallel between output terminal 12 and the source of potential level $V_{SS}$. IGFETs 80(1) through 80(2n) are controlled by a gate electrode 81 which is a distributed, continuous doped polysilicon path, which is connected to the drain of p channel IGFET 30 at point 82(1). Adjacent pairs of points 82(i) and 82(i+1) can be interconnected via a conductive path 83(i) which can be formed during the first metallization step of the integrated circuit fabrication process. Successive adjacent pairs of IGFETs 80(i) and 80(i+1) have common sources. Each successive adjacent pair 80(i) and 80(i+1) can be selectively connected by a common conductive path 85i to conductive link 87 for providing connection between the respective IGFETs and output terminal 12. Each output driver IGFET 80(i) is connected at its source to $V_{SS}$.

A plurality of gate control IGFETs 90(1) through 90(n) are connected in parallel between gate 81 and $V_{SS}$. The gate electrodes of IGFETs 90(1) through 90(n) are connected to terminal 24. Accordingly, IGFETs 90 turn on and off in opposite phase with IGFET 30 in response to signal S2.

Signals S1 and S2, when both are present, turn IGFETs 26 and 30 on and off in opposite phase so that output terminal 12 is connected to $V_{SS}$, or $V_{DD}$, where S1 and S2 are not present, output terminal 12 is connected to neither $V_{DD}$ nor $V_{SS}$. Output terminal 12 is never connected to $V_{SS}$ and $V_{DD}$ simultaneously. Logic network 20 may be configured, as explained below, so that only pull-up circuit 28 or pull-down circuit 32 responds to a data signal on input terminal 16. Accordingly, signals consisting exclusively of ones or zeros may be transmitted via output terminal 12.

Figure 2A:
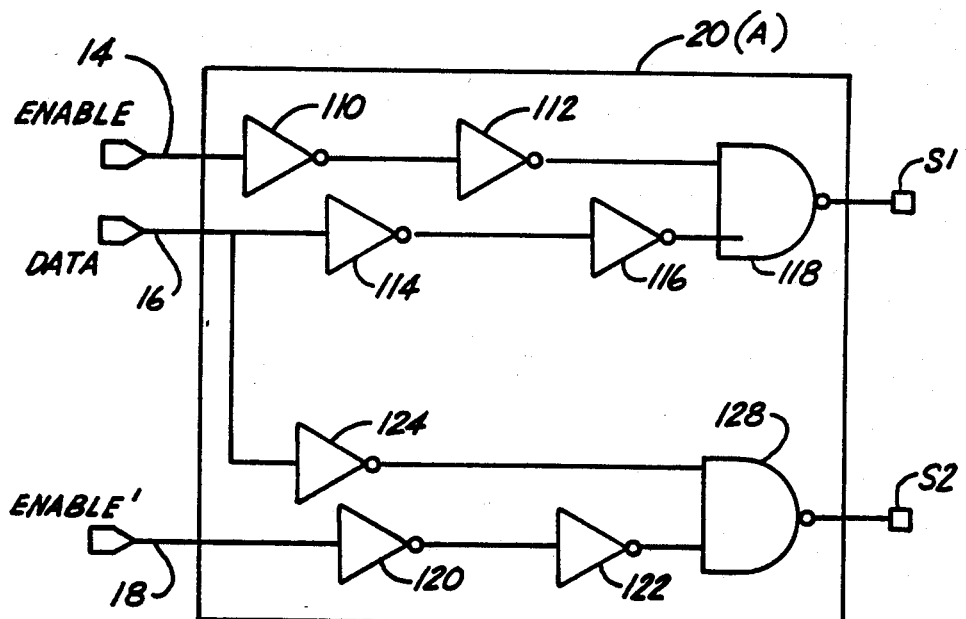
FIGS. 2A and 2B are block diagram schematics of logic networks for control of the CMOS output buffer of the present invention.
Figure 2B:
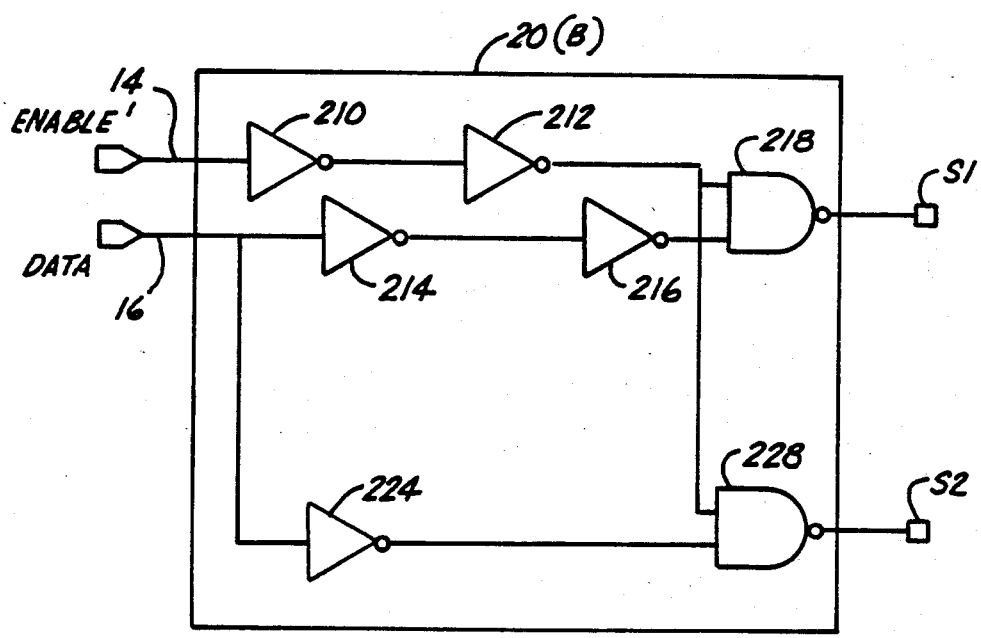

FIGS. 2A and 2B illustrate alternative logic arrangements for the development of control signals S1 and S2. Logic network 20(A) is adapted to receive a first enable signal, a second enable signal and a data signal being input on terminals 14, 18 and 16, respectively. Signals applied to enable terminal 14 are inverted twice by inverters 110 and 112 before being provided to NAND gate 118. Similarly, data signals on data terminal 16 are inverted twice by inverters 114 and 116 before being provided to the second input terminal of NAND gate 118. Inverters 110, 112, 114 and 116 provide buffering and delay of the input signals resulting in signal S1. A first control signal S1 is provided by NAND gate 118 for actuation of pull-up circuit 28 in response to receipt of an enable signal and logical "1"s received on data terminal 16.

The second enable signal is received on enable terminal 18 and is inverted by inverters 120 and 122 before being provided to a first input terminal of NAND gate 128. The data signal appearing on terminal 16 is inverted once by inverter 124 before being provided to the second input terminal of NAND gate 128. NAND gate 128 provides a second control signal S2 in response to the presence of the second enable signal and logical "0"s received on data terminal 16. It should be apparent that either or both of the enable signals can be provided for controlling actuation of first and second control signals S1 and S2. Because control signals S1 and S2 are dependent upon the state of the input data on data input terminals 16, it should be apparent that if both enable signals are present the signals provided on S1 and S2 will be out of phase. Signals will not in any event occur on S1 and S2 which would cause both the pull-up and pull-down circuits to turn on simultaneously. Turn off of the output driver IGFETs is more rapid than turn on, providing displacement of turn on between pull-up circuit 28 and pull-down circuit 32 for preventing current flow directly from $V_{DD}$ to $V_{SS}$ by conductive paths 47 and 87.

Logic network 20(B) is equivalent to logic network 20(A) with enable terminals 14 and 18 interconnected. In logic network 20(B), an enable signal provided on enable terminal 14 is inverted by inverters 210 and 212 and fed to the first inputs of NAND gates 218 and 228. Data signals occurring on data terminal 16 are inverted by inverters 214 and 216 to be fed to the second input gate of NAND gate 218 for generating signal S1 and the data signals are inverted once by inverter 224 and provided to the second input terminal of NAND gate 228 for the generation of second control signal S2.

Figure 3:
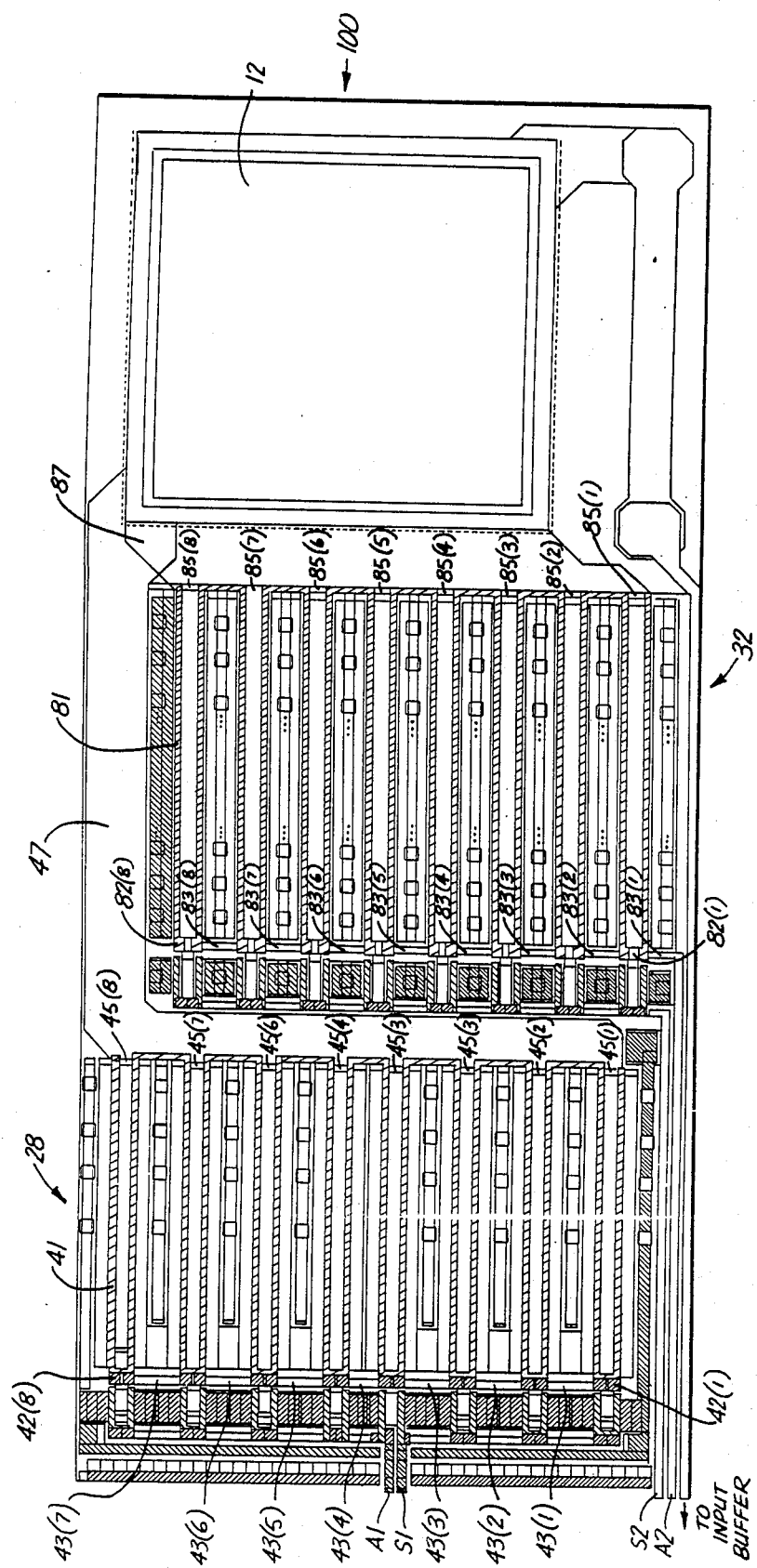
FIG. 3 is a top view of a first metallization layer applied in the CMOS output pull-up and pull-down circuits.

FIG. 3 illustrates the first metallization fabrication step of pull-up circuit 28 and pull-down circuit 32. Gate electrodes 41 and 81 are continuous, doped polysilicon conductors which follow along a circuitous path across the body of semiconductor chip 100. The metallization pattern shown is purely exemplary and a number of alternatives are possible. Input A1 is provided from the drain of IGFET 26 (shown at FIG. 1) and A2 is provided from the drain of IGFET 30 (shown at FIG. 1) and correspond to actuation signals directed to the output driver IGFETs to effect turn on thereof. Control signals S1 and S2 are provided as indicated. The metallization paths subject to selective inclusion and exclusion are indicated generally at 43, 45, 83 and 85. Conductive path 83(3) has been omitted during metallization by provision of an appropriate mask. A signal transmitted through conductive paths 83(1) and 83(2) would reach conductive path 83(4) only by propagating along resistive gate 81. The time rate of change of current is prescribed by selective omission or inclusion of 43(i) and 83(i).

By selectively connecting the desired number of conductive paths 45(1-7) and 85(1-7), the output current provided output terminal 12 may be varied over a substantial range. The time rate of change of current is prescribed by selective omission or inclusion of 43(i) and 83(i).

The present invention provides a CMOS output driver which can be very simply customized to the demands of a particular use through minor modification of a single metallization mask. A lumped load application can be provided with a graduated turn-on characteristic, while a transmission line application can be provided with a rapid and synchronized turn-on of all desired current. A wide variety of current demands can be met. The invention provides an essentially standardized integrated circuit suitable for driving lumped or distributed loads.

Although the present invention has been described with reference to preferred embodiment, workers skilled in the art will recognize that changes may be made in form and detail without departing from the spirit and scope of the invention.

What is claimed is:

1. An output buffer for prescribing different parameters of an output signal appearing on an output terminal, the output buffer comprising:

a pull-up circuit responsive to a first signal for pulling the output signal toward a first potential level, the pull-up circuit including a plurality of output driver transistors, each driver transistor having an input electrode, an output electrode and a control electrode, the control electrodes being interconnection through different metallization patterns for prescribing a time rate of response of the pull-up circuit to the first signal; and a pull-down circuit responsive to a second signal for pulling the output signal toward a second potential level, the pull-down circuit including a plurality of output driver transistors, each driver transistor having an input electrode, an output electrode and a control electrode, the control electrodes being interconnection through different metallization patterns for prescribing a time rate of response of the pull-down circuit to the second signal.

2. The output buffer of claim 1 further comprising a plurality of first nonconductive regions, each nonconductive region supporting a metallization pattern connecting the output electrode of a pull-up output driver transistor with the output terminal for prescribing the output current.

3. The output buffer of claim 2 further comprising a plurality of second nonconductive regions, each supporting a metallization pattern connecting the input electrode of a pull-down output driver transistor with the output terminal for prescribing the output current.

4. The output buffer of claim 3 wherein the pull-up and pull-down output driver transistors are n-channel IGFETs, the control electrodes of the pull-up driver IGFETs are discrete portions of a first continuous, doped polysilicon gate and the control electrodes of the pull-down driver IGFETs are discrete portions of a second continuous, doped polysilicon gate.

5. The output buffer of claim 4 wherein the first and second continuous gates are disposed over a plurality of channel regions, each channel region corresponding to an individual driver IGFET.

6. The output buffer of claim 5 further comprising means responsive to the first signal for applying a first actuation signal at a point of application on the first continuous gate electrode such that the actuation signal propagates along the continuous gate electrode from the point of application.

7. The output buffer of claim 6 further comprising a third set of nonconductive regions connecting pairs of different points on the first continuous gate, each nonconductive region receiving a metallization pattern connecting point on the first gate to another point on the first gate.

8. The output buffer of claim 7 wherein the point of application of the first actuation signal is one of the points among the pairs of points connected by the third set of nonconductive regions.

9. The output buffer of claim 5 further comprising means responsive to the second signal for applying a second actuation signal at a point of application on the second continuous gate such that the second actuation signal propagates along the second continuous gate from the point of application.

10. The output buffer of claim 9 further comprising a fourth set of nonconductive regions connecting pairs of different points on the second continuous gate, each nonconductive region receiving a metallization pattern connecting one point of the first gate to another point of the first gate.

11. The output buffer of claim 10 wherein the point of application of the second actuation signal is one of the points among the pairs of points connected by the fourth set of nonconductive regions.

12. A CMOS output buffer for producing an output signal on an output terminal connected to a distributed load, the output buffer comprising:
  a pull-up circuit responsive to a first signal for pulling the output signal toward a first potential level, the pull-up circuit including a plurality of pull-up output driver IGFETs, each output driver IGFET having a gate, a source and a drain, the pull-up output driver IGFETs defining a plurality of parallel current paths formable by their sources and drains connected between the output terminal and a source of the first level of potential and the pull-up circuit having means connected to the gate of each output driver IGFET for causing the pull-up output driver IGFETs to turn on and off synchronously; and
  a pull-down circuit responsive to a second signal for pulling the output signal toward a second potential level, the pull-down circuit including a plurality of pull-down output driver IGFETs, each output driver IGFET having a gate, a source and a drain, the pull-down output driver IGFETs defining a plurality of current paths formable by their drains and sources connected between the output terminal and a source of the second level of potential and the pull-down circuit having means connected to the gate of each output driver IGFET for causing the pull-down output driver IGFETs to turn on and off synchronously.

13. The output buffer of claim 12 wherein the means for causing the pull-up output driver IGFETs to turn on and off synchronously includes:
  an input terminal coupled to receive the first signal;
  a control IGFET for turning on the pull-up output drivers having a gate, a source and a drain, the gate being connected to the input terminal, the source being connected to the source of the first level of potential and the drain being connected to the gates of each of the pull-up output driver IGFETs; and
  a control IGFET for turning off the pull-up output drivers having a gate, a source and a drain, the gate being connected to the input terminal, the source being connected to the source of the second level of potential and the drain being connected to the gates of the pull-up output drivers.

14. The output buffer of claim 12 wherein the means for causing the pull-down output driver IGFETs to turn on and off synchronously includes:
  an input terminal coupled to receive the second signal;
  a control IGFET for turning on the pull-down output drivers having a gate, a source and a drain, the gate being connected to the input terminal, the source being connected to the source of the first level of potential and the drain being connected to the gates of each of the pull-down output driver IGFETs; and
  a control IGFET for turning off the pull-down output drivers having a gate, a source and a drain, the gate being connected to the input terminal, the source being connected to the source of the second level of potential and the drain being connected to the gates of the pull-up output drivers.

15. The output buffer of claim 12 further comprising a logic network coupled to receive a first enable signal and a data signal for controlling generation of the first and second signals on first and second terminals, respectively, the logic network having input terminals for receiving the first enable signal and the data signal, a buffering network for buffering the enable signal and the data signal and a logic network responsive to the buffered enable signal and data signal for generating first actuation signals in response to data signals of logic level 1 and second actuation signals in response to data signals of logic level 0.

16. The output buffer of claim 12 further comprising a logic network coupled to receive a first enable signal, a second enable signal and a data signal for controlling generation of the first and second signals on first and second terminals respectively, the logic network having input terminals for receiving the first enable signal, the second enable signal and the data signal, a buffering network for buffering the enable signals and the data signal and a logic network responsive to the buffered enable signals and data signals for generating first actuation signals in response to data signals of logic level 1 and the first enable signal, and second actuation signals in response to data signals of logic level 0 and the second enable signal.

17. A CMOS output buffer for prescribing parameters of an output signal on an output terminal connected to a distributed load, a lumped load, or a mixed distributed and lumped load, the output buffer comprising:
  a pull-up circuit responsive to a first signal for pulling the output signal toward a first potential level, the pull-up circuit including a plurality of output driver IGFETs, each output driver IGFET having a gate means, a source and a drain, and each output driver IGFET being connected at its drain to a source of the first level of potential, each driver having a formable current path from its source to the output terminal by an appropriate metallization pattern for prescribing the current of the output signal and the pull-up circuit having means connected to the gate means for causing a pull-up output driver IGFET to turn on and off where a current path is formed from the source of the output driver IGFET to the output terminals; and a pull-down circuit responsive to a second signal for pulling the output signal toward a second potential level, the pull-down circuit including a plurality output driver IGFETs, each output driver IGFET having gate means, a source and a drain, and each output driver IGFET having a formable current path from its drain to the output terminal by an appropriate metallization pattern for prescribing the output current and the pull-up circuit having means connected to the gate means for causing a pull-down output driver IGFET to turn on and off where a current path is formed from the drain of the output driver to the output terminal.

18. The CMOS output buffer of claim 17 wherein the means for causing the pull-up output driver IGFETs to turn on and off includes:
a continuous, electrically resistive path positioned so that portions of the resistive path provide the gate means for the pull-up driver IGFETs; and
a first control IGFET for providing an actuation signal to turn on the pull-up output drivers, the first control IGFET having a gate, a source and a drain, the gate being connected to an input terminal for receiving the first signal, the source being connected to the source of the first level of potential and the drain being connected to a point on the continuous resistive path for applying the actuation signal thereto, such that the actuation signal propagates outward on the continuous resistive electrode from the point of application.

19. The output buffer of claim 18 further comprising a set of formable current paths connecting pairs of different points on the first continuous resistive path, each formable current path being a short circuit between points of the resistive path.

20. The output buffer of claim 19 wherein the point of application of the first actuation signal is one of the points among the pairs connected by the third set of formable current paths.

21. The CMOS output buffer of claim 17 wherein the means for causing the pull-down output driver IGFETs to turn on and off includes:
a second continuous, electrically resistive path positioned so that portions of the resistive path provide the gate means of the pull-down driver IGFETs; and
a second control IGFET for providing an actuation signal to turn on the pull-up output drivers having a gate, a source and a drain, the gate being connected to an input terminal for receiving the second signal, the drain being connected to the source of the second level of potential and the drain being connected to a point on the second continuous resistive path for applying the actuation signal thereto, such that the actuation signal propagates along the second continuous resistive electrode from the point of application.

22. The output buffer of claim 21 further comprising a fourth set of formable current paths connecting pairs of different points on the second continuous resistive path, each formable current path being a short circuit between points of the resistive path.

23. The output buffer of claim 22 wherein the point of application of the second actuation signal is one of the points among the pairs connected by the fourth set of formable current paths.

24. A CMOS output buffer for prescribing parameters of an output signal on an output terminal connected to a distributed load, a lumped load, or a mixed distributed and lumped load, the output buffer comprising:
a pull-up circuit responsive to a first signal for pulling the output signal toward a first potential level, the pull-up circuit including a plurality of output driver IGFETs, each output driver IGFET having a source, a drain and a gate electrode, the gate electrodes being serially connected in a first, continuous resistive path, each output driver IGFET being connected at its drain to a source of the first level of potential and at its source to the output terminal and the pull-up circuit having means connected to a point on the continuous gate electrode for causing the pull-up output driver IGFET to turn on and off and means for short circuiting points of the first continuous, resistive path for prescribing a time rate at which the driver IGFETs turn on; and
a pull-down circuit responsive to a second signal for pulling the output signal toward a second potential level, the pull-down circuit including a plurality output driver IFGETs, each output driver IGFET having a source, a drain and a gate electrode, the gate electrodes being connected in a second, continuous resistive path, each output driver IGFET being connected at its source to a source of the second level of potential and at its drain to the output terminal and the pull-up circuit having means connected to the continuous, resistive gate electrode for causing the pull-down output driver IGFET to turn on and off and means for short circuiting points of the continuous, resistive gate electrode for prescribing a time rate at which the driver IGFETs turn on.

25. The CMOS output buffer of claim 24 wherein the means for turning the pull-up output drivers on and off includes a plurality of turn-off IGFETs having gates, drains and sources, each drain being connected to a different point on the first continuous, resistive path, each source to the source of the second level of potential and each gate being coupled to receive the first signal.

26. The CMOS output buffer of claim 24 wherein the means for turning the pull-down output drivers on and off includes a plurality of turn-off IGFETs having gates, drains and sources, each drain being connected to a different point on the second continuous, resistive path, each source to the source of the second level of potential and each gate being coupled to receive the second signal.

* * * * *

UNITED STATES PATENT AND TRADEMARK OFFICE
CERTIFICATE OF CORRECTION

PATENT NO. : 4,885,485

DATED : December 5, 1989

INVENTOR(S) : William W. Leake

It is certified that error appears in the above-identified patent and that said Letters Patent is hereby corrected as shown below:

Column 6, lines 41-42, delete "interconnection" and insert --interconnected--.

Column 6, line 51, delete "interconnection" and insert --interconnected--.

Column 7, line 18, after "connecting" insert --one--.

Signed and Sealed this

Ninth Day of October, 1990

*Attest:*

HARRY F. MANBECK, JR.

*Attesting Officer*      *Commissioner of Patents and Trademarks*